: (12) United States Patent
Liu et al.

(10) Patent No.: US 10,332,807 B2
(45) Date of Patent: Jun. 25, 2019

(54) ARRAY SUBSTRATE AND MANUFACTURING METHOD THEREOF

(71) Applicants: BOE Technology Group Co., Ltd., Beijing (CN); Hefei Xinsheng Optoelectronics Technology Co., Ltd., Hefei (CN)

(72) Inventors: Yudong Liu, Beijing (CN); Rongcheng Liu, Beijing (CN); Yunhai Wan, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 15/567,786

(22) PCT Filed: Mar. 3, 2017

(86) PCT No.: PCT/CN2017/075596
§ 371 (c)(1),
(2) Date: Oct. 19, 2017

(87) PCT Pub. No.: WO2017/185877
PCT Pub. Date: Nov. 2, 2017

(65) Prior Publication Data
US 2018/0211888 A1 Jul. 26, 2018

(30) Foreign Application Priority Data
Apr. 29, 2016 (CN) .......................... 2016 1 0284394

(51) Int. Cl.
*H01L 21/027* (2006.01)
*H01L 21/4757* (2006.01)
(Continued)

(52) U.S. Cl.
CPC .......... *H01L 21/84* (2013.01); *H01L 21/0273* (2013.01); *H01L 21/02271* (2013.01);
(Continued)

(58) Field of Classification Search
CPC ........... H01L 21/02271; H01L 21/0273; H01L 21/47573; H01L 21/84; H01L 27/12; H01L 27/1214
See application file for complete search history.

(56) References Cited

U.S. PATENT DOCUMENTS 7,351,623 B2 * 4/2008 Ahn ................... G02F 1/136286
257/E27.111
9,666,653 B2 * 5/2017 Li ........................... H01L 21/77
(Continued)

FOREIGN PATENT DOCUMENTS

CN  101556417 A  10/2009
CN  104752344 A  7/2015
(Continued)

OTHER PUBLICATIONS

Jul. 23, 2018—(CN) Office Action application 201610284394.7 with English Translation.
(Continued)

*Primary Examiner* — Mary A Wilczewski
(74) *Attorney, Agent, or Firm* — Banner & Witcoff, Ltd.

(57) ABSTRACT

An array substrate and a manufacturing method thereof are provided. The method for manufacturing the array substrate includes: forming a passivation layer on a base substrate; forming photoresist on the passivation layer, and forming a first photoresist pattern including a photoresist-completely-retained region, a photoresist-partially-retained region and a photoresist-completely-removed region, by exposure and development processes; forming a first through hole in the passivation layer by etching the passivation layer with the
(Continued)

first photoresist pattern as a mask; forming a second photoresist pattern by performing ashing on the first photoresist pattern to remove the photoresist in the photoresist-partially-retained region and reduce a thickness of the photoresist in the photoresist-completely-retained region; and etching the passivation layer with the second photoresist pattern as a mask, so as to reduce a thickness of the passivation layer in the photoresist-partially-retained region.

17 Claims, 4 Drawing Sheets

(51) Int. Cl.
*H01L 21/84* (2006.01)
*H01L 27/12* (2006.01)
*H01L 21/02* (2006.01)

(52) U.S. Cl.
CPC ........ *H01L 21/47573* (2013.01); *H01L 27/12* (2013.01); *H01L 27/1214* (2013.01)

(56) References Cited

U.S. PATENT DOCUMENTS

| | | | | |
|---|---|---|---|---|
| 9,741,750 B2* | 8/2017 | Jiang | ............... | H01L 21/77 |
| 9,876,037 B2* | 1/2018 | Lv | ............... | H01L 21/77 |
| 9,923,002 B2* | 3/2018 | Li | ............... | H01L 21/77 |
| 10,120,246 B2* | 11/2018 | Zhou | ............... | G02F 1/1343 |
| 2004/0048407 A1* | 3/2004 | Lee | ............... | H01L 27/1255 |
| | | | | 438/30 |
| 2005/0041169 A1* | 2/2005 | Hashimoto | ........... | G02F 1/1368 |
| | | | | 349/43 |
| 2006/0183263 A1* | 8/2006 | Lin | ............... | H01L 27/14658 |
| | | | | 438/57 |
| 2006/0186409 A1* | 8/2006 | Horino | ............... | G02F 1/136227 |
| | | | | 257/59 |
| 2007/0085116 A1* | 4/2007 | Lee | ............... | G02F 1/1345 |
| | | | | 257/291 |
| 2008/0012017 A1 | 1/2008 | Jung | | |
| 2008/0042132 A1* | 2/2008 | Shih | ............... | H01L 21/76838 |
| | | | | 257/59 |
| 2010/0159400 A1* | 6/2010 | Hong | ............... | G03F 7/425 |
| | | | | 430/322 |
| 2011/0050672 A1* | 3/2011 | Choi | ............... | G02F 1/136286 |
| | | | | 345/211 |
| 2014/0117371 A1* | 5/2014 | Ma | ............... | H01L 27/124 |
| | | | | 257/72 |
| 2015/0187825 A1* | 7/2015 | Xu | ............... | H01L 27/1288 |
| | | | | 438/158 |
| 2015/0214247 A1* | 7/2015 | Qin | ............... | G02F 1/1362 |
| | | | | 257/72 |
| 2016/0013220 A1* | 1/2016 | Zhang | ............... | H01L 27/1288 |
| | | | | 438/155 |
| 2016/0111442 A1* | 4/2016 | Wu | ............... | H01L 27/124 |
| | | | | 257/72 |
| 2016/0197191 A1* | 7/2016 | Cao | ............... | H01L 27/1225 |
| | | | | 257/43 |
| 2016/0268320 A1* | 9/2016 | Long | ............... | H01L 27/124 |
| 2016/0315105 A1 | 10/2016 | Lv et al. | | |
| 2016/0365361 A1* | 12/2016 | Jiang | ............... | H01L 21/77 |
| 2017/0110527 A1* | 4/2017 | Li | ............... | H01L 21/77 |
| 2017/0243902 A1* | 8/2017 | Li | ............... | H01L 21/77 |
| 2018/0211888 A1* | 7/2018 | Liu | ............... | H01L 21/02271 |
| 2018/0217454 A1* | 8/2018 | Zhou | ............... | G02F 1/1343 |

FOREIGN PATENT DOCUMENTS

| | | | | |
|---|---|---|---|---|
| CN | 105161504 A | 12/2015 | | |
| CN | 105931995 A | 9/2016 | | |
| JP | 2002341382 A | 11/2002 | | |
| JP | 2003341382 A | 12/2003 | | |
| WO | WO 2017/185877 | * 11/2017 | ............. | H01L 27/12 |

OTHER PUBLICATIONS

Jun. 8, 2017—(WO) International Search Report and Written Opinion application PCT/CN2017/075596 with English Translation.

* cited by examiner

US 10,332,807 B2

ARRAY SUBSTRATE AND MANUFACTURING METHOD THEREOF

The application is a U.S. National Phase Entry of International Application No. PCT/CN2017/075596 filed on Mar. 3, 2017, designating the United States of America and claiming priority to Chinese Patent Application No. 201610284394.7, filed Apr. 29, 2016. The present application claims priority to and the benefit of the above-identified applications and the above-identified applications are incorporated by reference herein in their entirety.

TECHNICAL FIELD

Embodiments of the present disclosure relate to an array substrate and a manufacturing method thereof.

BACKGROUND

Liquid crystal display (LCD) is a widely applied display device. The LCD mainly comprises an array substrate, an opposed substrate and a liquid crystal (LC) layer disposed between the array substrate and the opposed substrate. The array substrate includes thin-film transistors (TFTs). The LCD can achieve the drive control of the LC layer by electric fields produced between pixel electrode and common electrode connected with the TFTs, and hence achieve image display.

SUMMARY

Embodiments of the present disclosure provide an array substrate and a manufacturing method thereof. The manufacturing method of the array substrate can etch through holes and planarize a passivation layer on the premise of not increasing the number of masks, so the passivation layer can be smoother on the premise of not greatly increasing the cost, and various risks caused by non-uniform height of the array substrate can be reduced.

At least one embodiment of the disclosure provides a method for manufacturing an array substrate, comprising: forming a passivation layer on a base substrate; forming photoresist on the passivation layer, and forming a first photoresist pattern including a photoresist-completely-retained region, a photoresist-partially-retained region and a photoresist-completely-removed region, by exposure and development processes; forming a first through hole in the passivation layer by etching the passivation layer with the first photoresist pattern as a mask; forming a second photoresist pattern by performing ashing on the first photoresist pattern to remove the photoresist in the photoresist-partially-retained region and reduce a thickness of the photoresist in the photoresist-completely-retained region; and etching the passivation layer with the second photoresist pattern as a mask, so as to reduce a thickness of the passivation layer in the photoresist-partially-retained region, wherein the photoresist-completely-removed region of the first photoresist pattern corresponds to an area on the passivation layer, at which the first through hole is formed; and the photoresist-partially-retained region of the first photoresist pattern corresponds to an area on the passivation layer, of which the thickness is reduced.

For example, in the method for manufacturing the array substrate in one embodiment of the disclosure, according to a height from the base substrate to an upper surface of the passivation layer, the passivation layer includes an area having a first height and an area having a second height; the first height is greater than the second height; the photoresist-partially-retained region of the first photoresist pattern corresponds to the area having the first height; and the photoresist-completely-retained region of the first photoresist pattern corresponds to the area having the second height.

For example, in the method for manufacturing the array substrate in one embodiment of the disclosure, the thickness of the passivation layer in the photoresist-partially-retained region is reduced, so that the upper surface of the area of the passivation layer having the first height and the upper surfaces of the area of the passivation layer having the second height can have a same height.

For example, the method for manufacturing the array substrate in one embodiment of the disclosure further comprises: determining a thickness to be reduced of the area of the passivation layer having the first height according to a height difference between the first height and the second height.

For example, in the method for manufacturing the array substrate in one embodiment of the disclosure, the reduced thickness is less than the thickness of the passivation layer.

For example, the method for manufacturing the array substrate in one embodiment of the disclosure further comprises: calculating an etching rate and an etching time, required by the etching of the passivation layer having the reduced thickness, according to the reduced thickness.

For example, in the method for manufacturing the array substrate in one embodiment of the disclosure, the first photoresist pattern, including the photoresist-completely-retained region, the photoresist-partially-retained region and the photoresist-completely-removed region, is formed by performing exposure and development on the photoresist with a gray-tone mask or a half-tone mask as a mask.

For example, in the method for manufacturing the array substrate in one embodiment of the disclosure, a fully transparent area of the gray-tone mask or the half-tone mask corresponds to the photoresist-completely-removed region of the first photoresist pattern; a semitransparent area of the gray-tone mask or the half-tone mask corresponds to the photoresist-partially-retained region of the first photoresist pattern; and an opaque area of the gray-tone mask or the half-tone mask corresponds to the photoresist-completely-retained region of the first photoresist pattern.

For example, in the method for manufacturing the array substrate in one embodiment of the disclosure, before forming the passivation layer, further comprising: forming a thin-film transistor (TFT), wherein the area of the passivation layer having the first height correspond to an area provided with the TFT.

For example, the method for manufacturing the array substrate in one embodiment of the disclosure further comprises: forming a first electrode on the passivation layer, in which the first electrode is at least formed on the area of the passivation layer having the second height.

For example, in the method for manufacturing the array substrate in one embodiment of the disclosure, the thickness of the passivation layer in the photoresist-partially-retained region is reduced, so that the upper surface of the area of the passivation layer having the first height and an upper surface of the first electrode can have a same height.

For example, the method for manufacturing the array substrate in one embodiment of the disclosure further comprises: forming an insulating layer on the first electrode; and forming a second electrode on the insulating layer.

For example, in the method for manufacturing the array substrate in one embodiment of the disclosure, the thickness of the passivation layer in the photoresist-partially-retained region is reduced, so that a difference between the height of the upper surface of the passivation layer in the photoresist-partially-retained region and the height of the upper surface of the passivation layer in the photoresist-completely-retained region can be equal to a total thickness of the first electrode and the second electrode.

At least one embodiment of the disclosure provides an array substrate manufactured by the method for manufacturing the array substrate as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1:
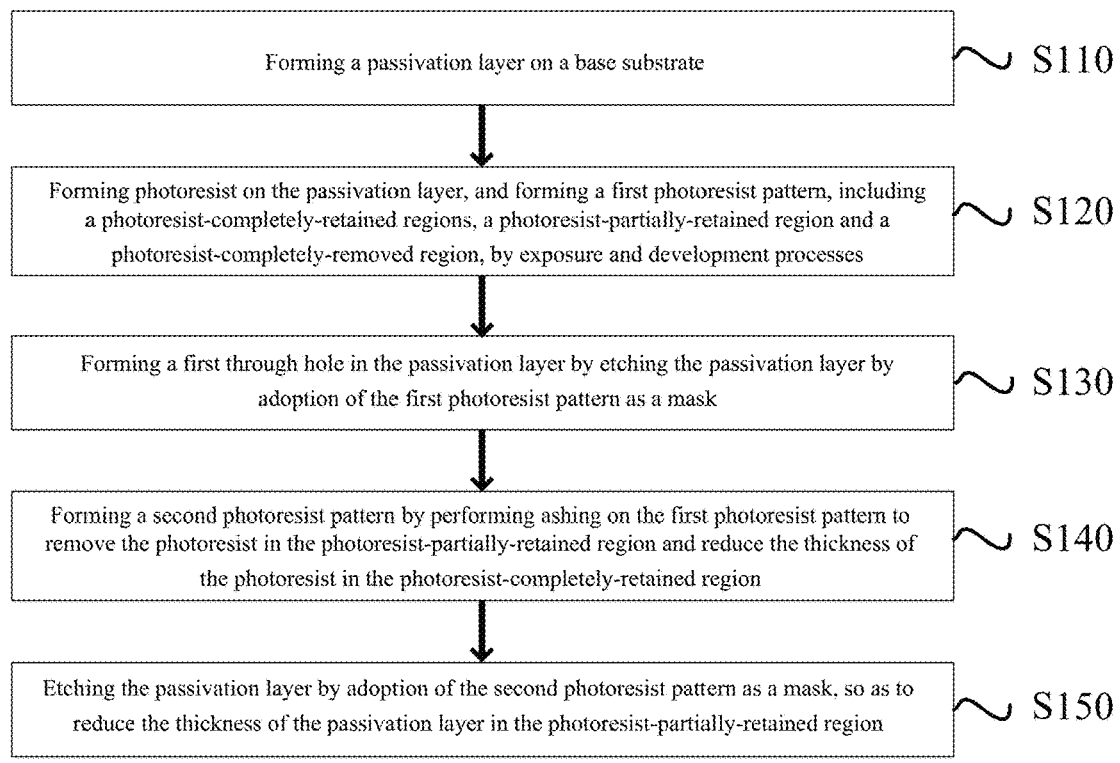
FIG. 1 is a flow diagram of a method for manufacturing an array substrate, provided by one embodiment of the present disclosure.

Reference numerals of the accompanying drawings:
101—base substrate; 102—gate electrode; 103—gate insulating layer; 104—active layer; 1051—source electrode; 1052—drain electrode; 106—dielectric layer; 1070—photoresist; 1071—photoresist-completely-retained region; 1072—photoresist-partially-retained region; 1073—photoresist-completely-removed region; 107—first photoresist pattern; 108—second photoresist pattern; 109—passivation layer; 1091—area of passivation layer having first height $H_1$; 1092—area of passivation layer having second height $H_2$; 1101—first through hole; 1102—second through hole; 111—first electrode; 112—second electrode/common electrode; 113—insulating layer 114—common electrode line; 150—half-tone mask/two-tone mask; 180—TFT.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise specified, the technical terms or scientific terms used in the present disclosure shall have normal meanings understood by those skilled in the art. The words "first", "second" and the like used in the present disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

Array substrate is an important component in an LCD and generally comprises a gate layer, a gate insulating layer, an active layer, a source/drain electrode layer, a passivation layer and an electrode layer. The inventor of the application has noted in the study that: layers overlapped in different areas on the array substrate are different, so the array substrate has different heights and hence reveals uneven state, affects the efficiency of liquid crystals, and may even have the defects such as non-uniform black-state distribution. In general, the unevenness of the array substrate may be covered by increasing the thickness of the passivation layer. However, the increase of the thickness of the passivation layer not only can result in the problems such as increased cost but also can increase the thickness of the array substrate, and hence is unfavorable for the light and thin design of the LCD. After research, the inventor of the application thinks that the etching of through hole and the planarization of a passivation layer on the premise of not increasing the thickness of the passivation layer and the number of masks allow the array substrate to be smoother on the premise of not greatly increasing the cost, and hence reduce various defects caused by the non-uniform height of the array substrate.

Embodiments of the present disclosure provide an array substrate and a manufacturing method thereof. The manufacturing method of the array substrate comprises: forming a passivation layer on a base substrate; forming photoresist on the passivation layer, and forming a first photoresist pattern, including a photoresist-completely-retained region, a photoresist-partially-retained region and a photoresist-completely-removed region, by exposure and development processes; forming a first through hole in the passivation layer by etching the passivation layer by adoption of the first photoresist pattern as a mask; forming a second photoresist pattern by performing ashing on the first photoresist pattern to remove photoresist in the photoresist-partially-retained region and reduce the thickness of photoresist in the photoresist-completely-retained region; and etching the passivation layer by adoption of the second photoresist pattern as a mask, so as to reduce the thickness of the passivation layer in the photoresist-partially-retained region. By reduction of the thickness of partial passivation layer, the height difference between different areas of the passivation layer can be reduced, so the planarization degree can be increased. On the other hand, as the reduction of the thickness of partial passivation layer and the etching of the through holes in the passivation layer are performed in one masking process, the use frequency of the mask can be reduced, so the cost can be reduced.

Description will be given below to the array substrate and the manufacturing method thereof, provided by the embodiment of the present disclosure, with reference to the accompanying drawings.

First Embodiment

The embodiment provides a method for manufacturing an array substrate. As illustrated in FIG. 1, the method comprises the following steps S110 to S150.

Figure 2:
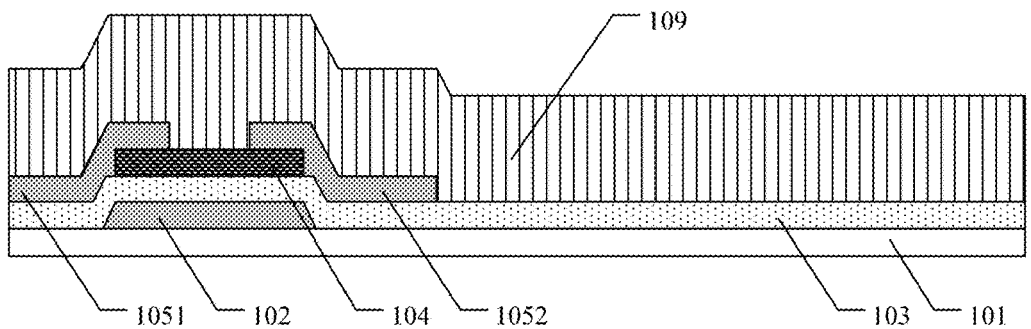
FIG. 2 is a schematic diagram illustrating the process of forming a passivation layer on a base substrate in one embodiment of the present disclosure.

S110: as illustrated in FIG. 2, providing a base substrate 101, and forming a passivation layer 109 on the base substrate 101.

For example, the base substrate 101 may be a glass substrate, a quartz substrate, a resin substrate or other substrates; and the materials of the passivation layer 102 may be inorganic insulating materials such as silicon nitride (SiNx), silicon oxide (SiOx) or silicon oxynitride (SiNxOy) or organic insulating materials such as polyimide.

For example, the thickness of the passivation layer 109 may be 3,000-6,000 Å.

For example, the passivation layer 109 may be formed on the base substrate 101 by vapor deposition process, chemical vapor deposition (CVD), coating process, sol-gel process or other processes.

Figure 5:
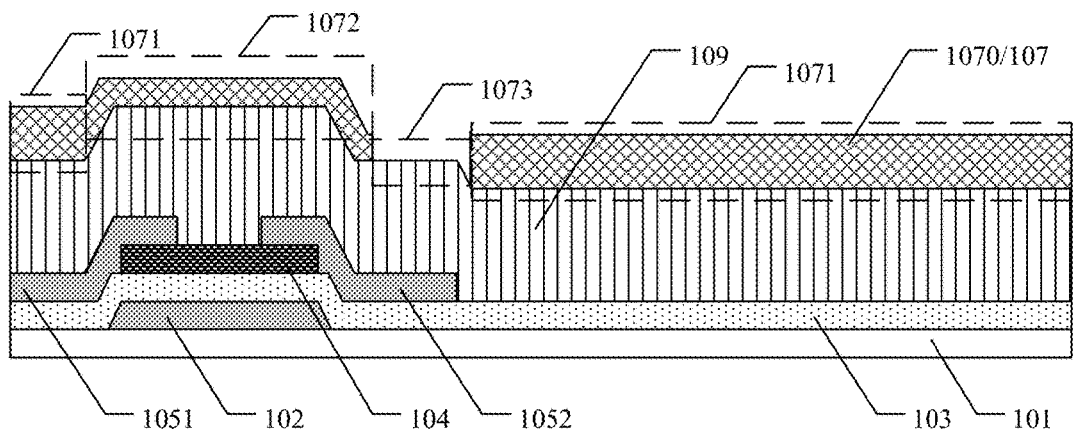
FIG. 5 is a schematic structural view of an array substrate provided with first photoresist pattern, provided by one embodiment of the present disclosure.

S120: as illustrated in FIG. 5, forming photoresist 1070 on the passivation layer 109, and forming a first photoresist pattern 107, including a photoresist-completely-retained region 1071, a photoresist-partially-retained region 1072 and a photoresist-completely-removed region 1073, by exposure and development processes. For example, the thickness of the photoresist 1070 is 1000-5000 Å.

Figure 3:
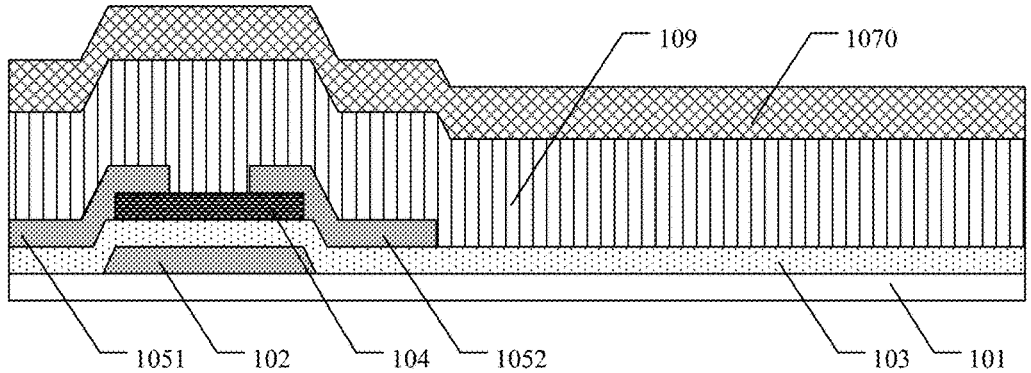
FIG. 3 is a schematic diagram illustrating the process of forming photoresist on the passivation layer in one embodiment of the present disclosure.
Figure 4:
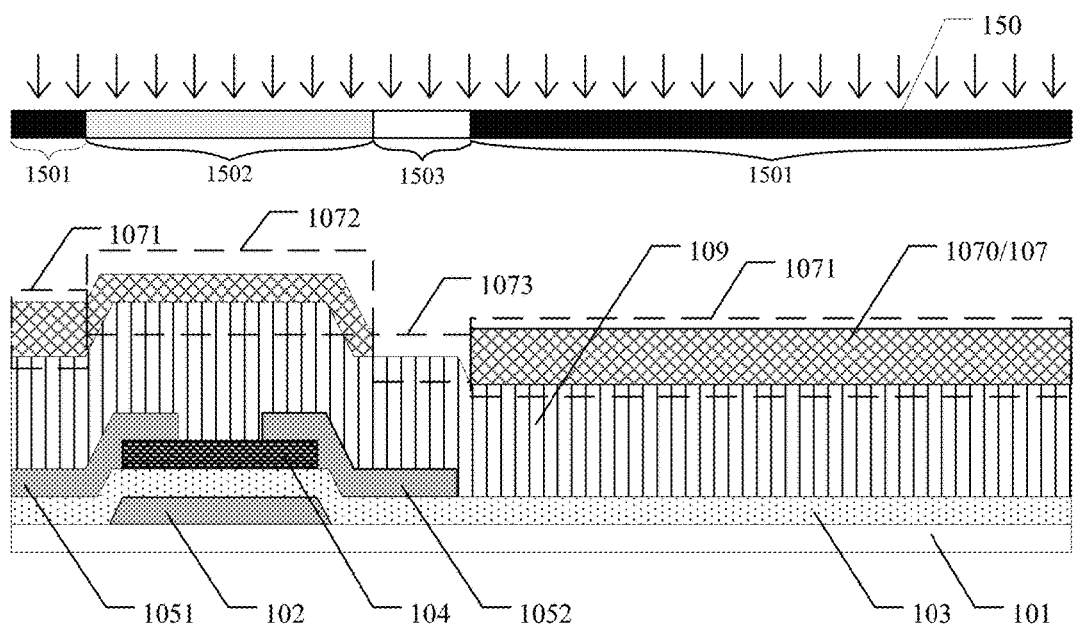
FIG. 4 is a schematic diagram illustrating the process of forming first photoresist pattern by photoresist exposure and development in one embodiment of the present disclosure.

For example, as illustrated in FIGS. 3 and 4, one layer of photoresist 1070 is formed on the passivation layer 109 at first, and then the first photoresist pattern 107 including the photoresist-completely-retained region 1071, the photoresist-partially-retained region 1072 and the photoresist-completely-removed region 1073 are formed by performing exposure and development on the photoresist 1070 by adoption of a gray-tone mask 150 or a half-tone mask 150 as a mask.

For example, as illustrated in FIG. 4, a fully transparent area 1503 of the gray-tone mask 150 or the half-tone mask 150 may correspond to the photoresist-completely-removed region 1073 of the first photoresist pattern 107; a semitransparent area 1502 of the gray-tone mask 150 or the half-tone mask 150 corresponds to the photoresist-partially-retained region 1072 of the first photoresist pattern 107; and an opaque area 1501 of the gray-tone mask 150 or the half-tone mask 150 corresponds to the photoresist-completely-retained region 1071 of the first photoresist pattern 107. Of course, description is given here by taking positive photoresist as an example, but the embodiment includes but not limited thereto.

Figure 6:
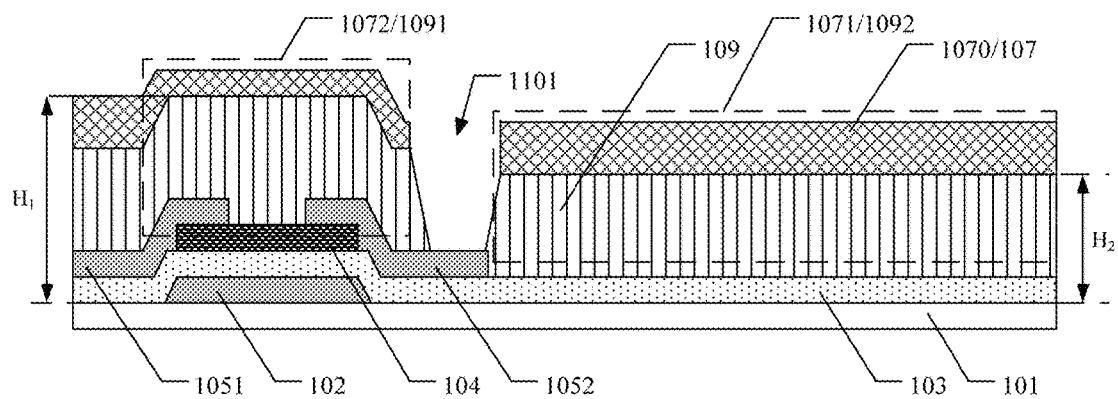
FIG. 6 is a schematic diagram illustrating the process of forming first through holes in one embodiment of the present disclosure.

S130: as illustrated in FIG. 6, forming a first through hole 1101 in the passivation layer 109 by etching the passivation layer 109 by adoption of the first photoresist pattern 107 as a mask.

Figure 7:
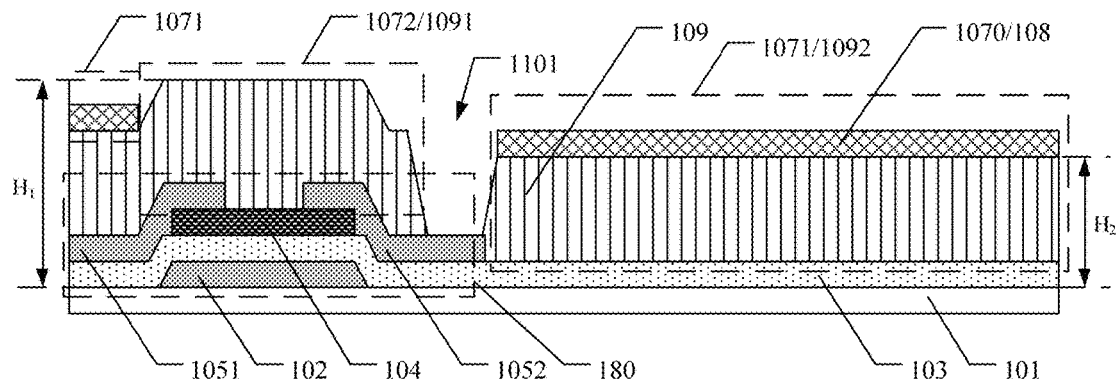
FIG. 7 is a schematic structural view of an array substrate provided with second photoresist pattern, provided by one embodiment of the present disclosure.

S140: as illustrated in FIG. 7, forming a second photoresist pattern 108 by performing ashing on the first photoresist pattern 107 to remove photoresist 1070 in the photoresist-partially-retained region 1072 and reduce the thickness of photoresist 1070 in the photoresist-completely-retained region 1071.

Figure 8:
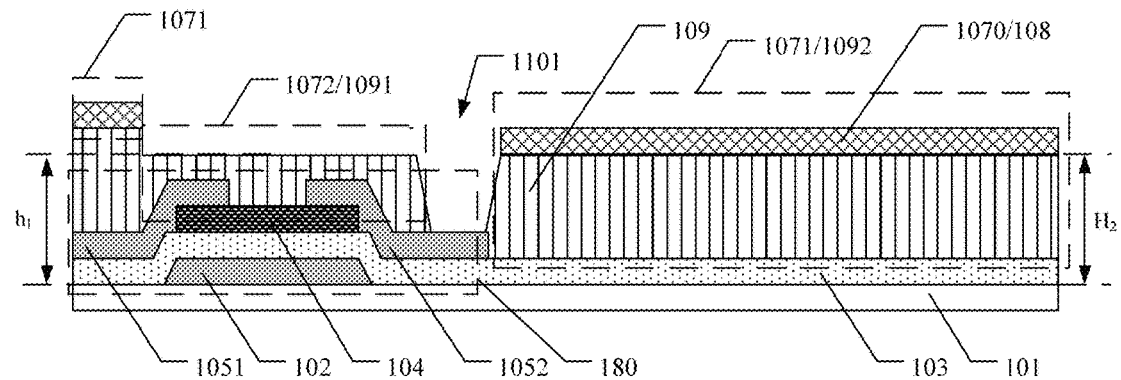
FIG. 8 is a schematic diagram illustrating the process of etching a passivation layer in one embodiment of the present disclosure.

S150: as illustrated in FIG. 8, etching the passivation layer 109 by adoption of the second photoresist pattern 108 as a mask, so as to reduce the thickness of the passivation layer 109 in the photoresist-partially-retained region 1072.

In the method for manufacturing the array substrate, provided by the embodiment, by reduction of the thickness of the passivation layer 109 in the photoresist-partially-retained region 1072, the height difference between different areas of the passivation layer 109 can be reduced, so the planarization degree of a surface of the passivation layer 109 can be increased. Thus, the planarization degree of the array substrate provided with the passivation layer 109 can be improved, and hence various defects such as low liquid crystal efficiency and non-uniform black-state distribution caused by the unevenness of the array substrate can be reduced. In addition, in the method for manufacturing the array substrate, provided by the embodiment, as the first photoresist pattern 107 including the photoresist-completely-retained region 1071, the photoresist-partially-retained region 1072 and the photoresist-completely-removed region 1073 are formed on the passivation layer 109, the first through hole 1101 may be formed and the thickness of partial passivation layer 109 may be reduced in one masking process, so the use frequency of the mask can be reduced, and hence the cost can be reduced.

For example, in the method for manufacturing the array substrate, provided by one example of the embodiment, the manufacturing method further comprises: removing the second photoresist pattern.

For example, in the method for manufacturing the array substrate, provided by one example of the embodiment, as illustrated in FIG. 5, the photoresist-completely-removed region 1073 of the first photoresist pattern 107 corresponds to an area on the passivation layer 109, at which the first through hole is to be formed; and the photoresist-partially-retained region 1072 of the first photoresist pattern 107 corresponds to an area on the passivation layer 109, of which the thickness is to be reduced. Thus, the first through hole may be formed at the area on the passivation layer 109, corresponding to the photoresist-completely-removed region 1073 of the first photoresist pattern 107, by etching process; and the photoresist-partially-retained region 1072 of the first photoresist pattern 107 is removed by ashing process, and then the thickness of the area on the passivation layer 109, corresponding to the photoresist-partially-retained region 1072 of the first photoresist pattern 107, is reduced by etching process. It should be noted that the etching process includes dry etching or wet etching. No limitation will be given here in the embodiment.

For example, in the method for manufacturing the array substrate, provided by one example of the embodiment, as illustrated in FIG. 6, the passivation layer 109 includes an area 1091 having a first height $H_1$ and an area 1092 having a second height $H_2$ according to the height from the base substrate 101 to an upper surface of the passivation layer 109. That is to say, the first height H1 refers to a height from the base substrate 101 to the upper surface of the passivation layer 109 in the area 1091, and the second height H2 refers to a height from the base substrate 101 to the upper surface of the passivation layer 109 in the area 1092. The first height $H_1$ is greater than the second height H2; the photoresist-partially-retained region 1072 of the first photoresist pattern 107 may correspond to the area 1091 having the first height $H_1$; and the photoresist-completely-retained region 1071 of the first photoresist pattern 107 may correspond to the area 1092 having the second height $H_2$. Thus, the thickness of the areas 1091 of the passivation layer 109 having the first height $H_1$ may be reduced, so as to be close to the area 1092 of the passivation layer 109 having the second height, and hence the passivation layer 109 can be planarized. It should be noted that: as the first height $H_1$ and the second height $H_2$ are used for determining the area of the passivation layer 109, of which the thickness must be required, so as to achieve the objective of planarization, the first height $H_1$ and the second height $H_2$ may be set according to actual conditions. It should be noted that the first height $H_1$ and the second height $H_2$ not only may refer to height with specific value but also may refer to height within specific value range. The difference between different heights within the value range of the first height $H_1$ is far less than the difference between the first height $H_1$ and the second height $H_2$.

For example, in the method for manufacturing the array substrate, provided by one example of the embodiment, the thickness of the passivation layer 109 in the photoresist-partially-retained region 1072 is reduced, so that the upper surface of the area 1091 of the passivation layer 109 having the first height $H_1$ and the upper surface of the area 1092 of the passivation layer 109 having the second height $H_2$ can have the same height, and hence the planarization degree of the passivation layer 109 can be greatly increased. For example, as illustrated in FIG. 8, the thickness of the areas 1091 of the passivation layer 109 having the first height $H_1$, obtained after thickness reduction, is $h_1$, and $h_1$ is equal to the second height $H_2$, so the planarization degree of the passivation layer 109 can be greatly increased.

For example, in the method for manufacturing the array substrate, provided by one example of the embodiment, the first height $H_1$ refers to height within specific value range, namely the areas 1091 of the passivation layer 109 having the first height $H_1$ have different heights, and the difference between the above different heights is far less than the difference between the first height $H_1$ and the second height $H_2$. At this point, an upper surface of one area with large area in corresponding passivation layer with different heights may be parallel and level to an upper surface of the area 1092 having the second height $H_2$, so that the planarization degree of the passivation layer 109 can be optimized. That is to say, when the area of the passivation layer having the first height $H_1$ has a plurality of heights, the height of a part in the area, with relatively large area of the passivation layer, may be selected as the criteria, so as to be parallel and level to the upper surface of the area of the passivation layer having the second height $H_2$. Similarly, when the area of the passivation layer having the second height $H_2$ has a plurality of heights, the height of a part in the area, with relatively large area of the passivation layer, may also be selected as the criteria, so as to be equal to the height of the area having the first height, obtained after thickness reduction.

For example, the method for manufacturing the array substrate, provided by one example of the embodiment, may further comprise: determining the thickness to be reduced of the areas 1091 of the passivation layer 109 having the first height $H_1$ according to the height difference between the first height $H_1$ and the second height $H_2$. For example, the thickness to be reduced of the areas 1091 of the passivation layer 109 having the first height $H_1$ may be equal to the height difference between the first height $H_1$ and the second height $H_2$.

For example, in the method for manufacturing the array substrate, provided by one example of the embodiment, the reduced thickness is less than the thickness of the passivation layer. It should be noted that: as the passivation layer must provide insulation protection to structures below the passivation layer, the passivation layer obtained after thickness reduction requires specific thickness, so the reduced thickness is less than the thickness of the passivation layer.

For example, the method for manufacturing the array substrate, provided by one example of the embodiment, may further comprise: calculating the etching rate and the etching time, required by the etching of the passivation layer with reduced thickness, according to the reduced thickness, so as to accurately etch the passivation layer and hence achieve the objective of planarization.

For example, tests may be executed for different thicknesses according to the materials of the passivation layer and an etching agent, so as to determine the etching rate and the etching time required by unit thickness; and subsequently, the etching rate and the etching time required by the etching of the passivation layer with the reduced thickness are calculated according to the reduced thickness.

For example, as illustrated in FIG. 7, before the step of forming the passivation layer, the method for manufacturing the array substrate, provided by one example of the embodiment, may further comprise: forming a TFT 180. The area 1091 of the passivation layer having the first height $H_1$ corresponds to the area provided with the TFT 180.

For example, as illustrated in FIG. 7, in the method for manufacturing the array substrate, provided by one example of the embodiment, the step of forming the TFTs 180 includes: forming a gate electrode 102 on the base substrate 101; forming a gate insulating layer 103 on the gate electrode 102; forming an active layer 104 on the gate insulating layer 103; and forming a source electrode 1051 and a drain electrode 1052, connected with the active layer 104, on the active layer 104. The passivation layer 109 is formed on the source electrode 1051 and the drain electrode 1052. The first through hole 1101 is formed on the drain electrode 1052 so as to expose the drain electrode 1052.

It should be noted that: in the area 1091 of the passivation layer 109 having the first height $H_1$, the passivation layer 109 formed on the source electrode 1051 and the drain electrode 1052 on the active layer 104 may have a greater height, and the passivation layer 109 formed on channel region of the active layers 104 may have a lower height. As the difference between the two heights is far less than the difference between the first height $H_1$ and the second height $H_2$, the passivation layer 109 formed on the source electrode 1051 and the drain electrode 1052 on the active layer 104 and the passivation layer 109 formed on the channel region of the active layer 104 may be considered as the area 1091 having the first height $H_1$. When the passivation layer 109 is thick, the reduced thickness may be set to be large, and the height of an upper surface of the passivation layer 109 formed on the source electrode 1051 and the drain electrode 1052 on the active layer 104 may be taken as the criteria of the first height $H_1$, so as to be the same with the height of the upper surface of the area 1092 of the passivation layer 109 having the second height $H_2$. When the passivation layer 109 is thinned and not enough to reduce the reduced thickness, the reduced thickness may be set to be small, and the height of the passivation layer 109 formed on the channel region of the active layers 104 may be considered as the criteria of the first height $H_1$, so as to be the same with the height of the upper surfaces of the area 1092 of the passivation layer 109 having the second height $H_2$. In addition, according to actual demands, the passivation layer formed on the source electrode and the drain electrode on the active layer may also be considered as the areas having the first height $H_1$, and the passivation layer formed on the channel regions of the active layers may also be considered as the area having the second height $H_2$, so as to planarize the passivation layer formed on the TFT. That is to say, the embodiment may be used for the planarization of two areas on the passivation layer having any different heights. No limitation will be given here in the embodiment.

For example, in the method for manufacturing the array substrate, provided by one example of the embodiment, as illustrated in FIG. 7, the height difference between the area of the passivation layer 109 having the first height $H_1$ and the area of the passivation layer 109 having the second height $H_2$ may be substantially determined by the thickness of the gate electrode 102, the thickness of the active layer 104, or the thickness of the source electrode 1051 and the drain electrode 1052. Thus, the reduced thickness may also be determined by the thickness of the gate electrode 102, the thickness of the active layer 104, or the thickness of the source electrode 1051 and the drain electrode 1052 in actual conditions.

Figure 9:
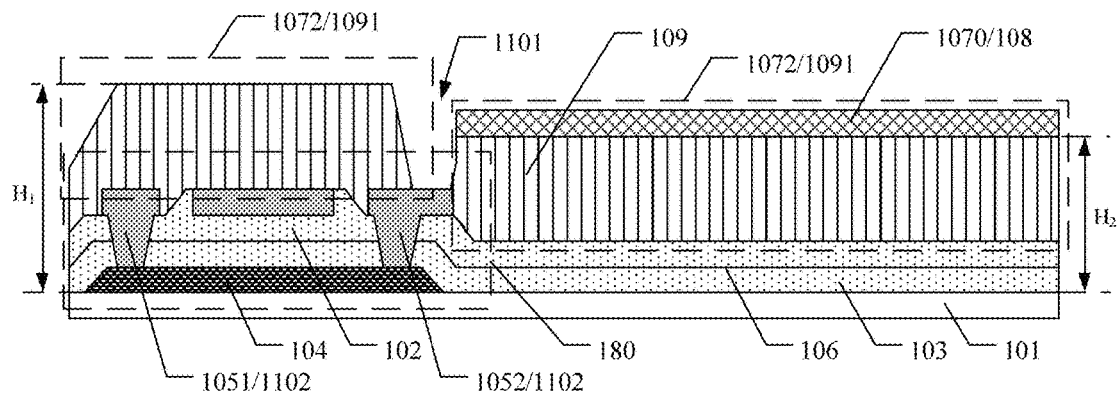
FIG. 9 is a schematic structural view of another array substrate provided with second photoresist pattern, provided by one embodiment of the present disclosure.

For example, as illustrated in FIG. 9, in the method for manufacturing the array substrate, provided by one example of the embodiment, the step of forming the TFT 180 includes: forming an active layer 104 on a base substrate 101; forming a gate insulating layer 103 on the active layer 104; forming a gate electrode 102 on the gate insulating layer 103; forming a dielectric layer 106 on the gate electrode; forming second through holes 1102 for exposing the active layer 104 in the dielectric layer 106 and the gate insulating layer 103; and forming a source electrode 1051 and a drain electrode 1052 on the dielectric layer 106, in which the source electrode 1051 and the drain electrode 1052 are respectively connected with the active layer 104 via the second through hole 1102; the passivation layer 109 is formed on the source electrode 1051 and the drain electrode 1052; and the first through hole 1101 is formed on the drain electrode 1052 to expose the drain electrode 1052. As illustrated in FIG. 9, the area of the passivation layer 109 having the first height $H_1$ corresponds to the area provided with the TFT 180. It should be noted that the TFT 180 is a bottom-gate TFT. In this case, the etching of the passivation layer and the forming and ashing of the photoresist pattern may refer to the foregoing relevant content. No further description will be given here.

Figure 10:
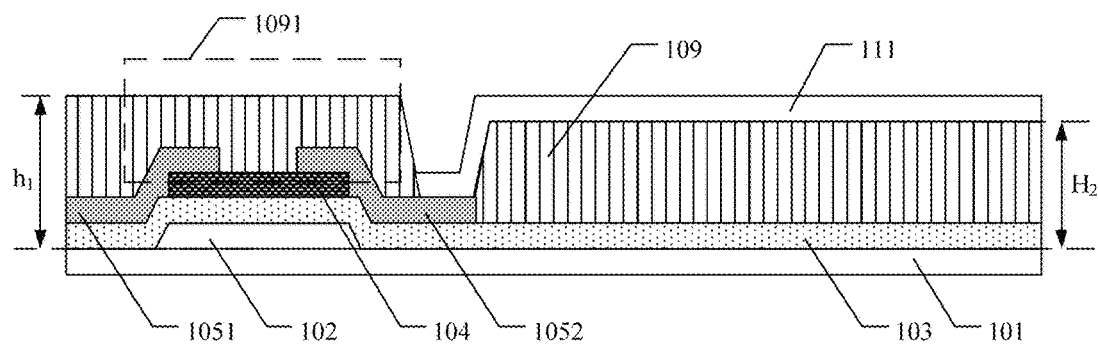
FIG. 10 is a schematic structural view of an array substrate provided with a first electrode, provided by one embodiment of the present disclosure.

For example, taking the array substrate provided with the top-gate TFT as illustrated in FIG. 7 as an example, as illustrated in FIG. 10, the method for manufacturing the array substrate, provided by one example of the embodiment, may further comprise: forming a first electrode 111 on the passivation layer 109, in which the first electrode 111 is at least formed on the area 1092 of the passivation layer 109 having the second height $H_2$. Of course, the first electrode 111 may also be partially formed in the through hole 1101 so as to be electrically connected with the drain electrode 1052.

For example, in the method for manufacturing the array substrate, provided by one example of the embodiment, as illustrated in FIG. 10, the thickness of the passivation layer 109 in the photoresist-partially-retained region 1072 is reduced, so that the height between the upper surface of the area 1091 of the passivation layer 109 having the first height $H_1$ and the upper surface of the first electrode 111 can be the same. Thus, relative to the second height $H_2$, the height of one first electrode 111 may be reserved in the area 1091 of the passivation layer 109 having the first height $H_1$, so as to further increase the overall planarization degree of the array substrate obtained after the step of forming the first electrode 111. Obviously, the array substrate provided with the bottom-gate TFT as illustrated in FIG. 9 may also include the first electrode. No further description will be given here to the specific forming steps, the layout and the effects of the array substrate.

Figure 11:
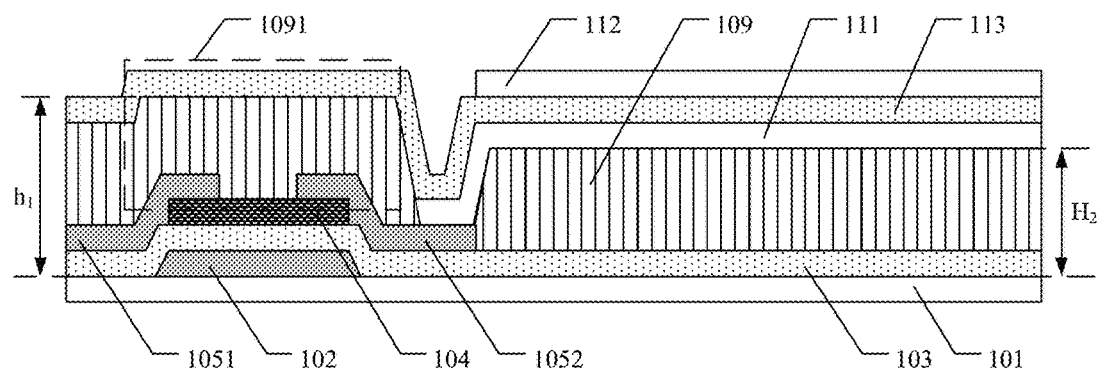
FIG. 11 is a schematic structural view of an array substrate provided with a second electrode, provided by one embodiment of the present disclosure.

For example, taking the array substrate provided with the top-gate TFT as illustrated in FIG. 10, as illustrated in FIG. 11, the method for manufacturing the array substrate, provided by one example of the embodiment, may further comprise: forming an insulating layer 113 on the first electrode 111; and forming a second electrode 112 on the insulating layer 113.

For example, in the method for manufacturing the array substrate, provided by one example of the embodiment, as illustrated in FIG. 11, the thickness of the passivation layer 109 in the photoresist-partially-retained region 1072 is reduced. Moreover, relative to the second height $H_2$, the height of one first electrode 111 and the height of one second electrode 112 may be reserved in the area 1091 of the passivation layer 109 having the first height $H_1$, so that the upper surface of the array substrate in the areas 1091 of the passivation layer 109 having the first height $H_1$ and the upper surface of the second electrode 112 can have the same height, and hence the overall planarization degree of the array substrate obtained after the step of forming the first electrode 111 and the second electrode 112 can be further increased. Obviously, the array substrate provided with the bottom-gate TFTs as illustrated in FIG. 9 may also include the first electrode. The specific forming steps, the layout and the effects of the array substrate will not be further described here.

Figure 12:
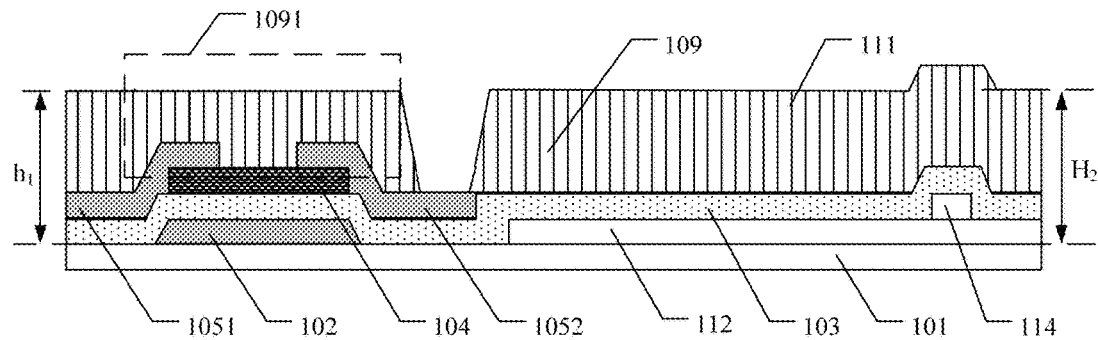
FIG. 12 is a schematic structural view of another array substrate provided with a second electrode, provided by the embodiment of the present disclosure.

For example, taking the array substrate provided with the top-gate TFTs as illustrated in FIG. 7 as an example, as illustrated in FIG. 12, the method for manufacturing the array substrate, provided by one example of the embodiment, may further comprise: forming a second electrode 1112 on the base substrate 101, in which the second electrode 112 is formed on the area 1092 of the passivation layer 109 having the second height $H_2$, and between the passivation layer 109 and the base substrate 101. That is to say, the thickness of the passivation layer 109 in the photoresist-partially-retained region is reduced, so that the difference between the height of the upper surface of the passivation layer in the photoresist-partially-retained region and the height of the upper surface of the passivation layer 109 in the photoresist-completely-retained region can be equal to the sum of the thickness of the first electrode 111 and the second electrode 112. Obviously, the array substrate provided with the bottom-gate TFT as illustrated in FIG. 9 may also include the second electrode. The specific forming steps, the layout and the effects of the array substrate will not be further described here.

For example, in the method for manufacturing the array substrate, provided by one example of the embodiment, the first electrode 111 include a pixel electrode and the second electrode 112 include a common electrode, or the first electrode 111 include the common electrode and the second electrode 112 include the pixel electrode.

For example, as illustrated in FIG. 12, the method for manufacturing the array substrate, provided by one example of the embodiment, may further comprise: forming common a electrode line 114 connected with the common electrode 112.

Second Embodiment

Figure 13:
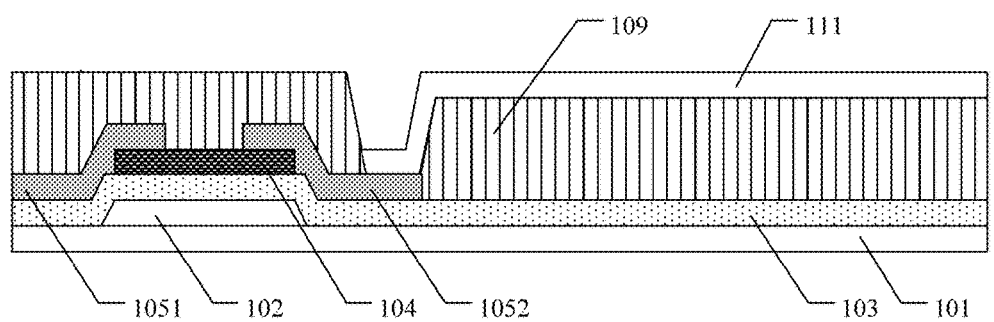
FIG. 13 is a schematic structural view of an array substrate provided by one embodiment of the present disclosure.

The embodiment provides an array substrate, which is manufactured by the method for manufacturing the array substrate, provided by the first embodiment. As illustrated in FIG. 13, the passivation layer 109 has a small thickness in the area provided with TFT 180 on the array substrate, so as to reduce the non-uniform height caused by different layers overlapped in different areas below the passivation layer 109. Thus, the planarization degree of the entire array substrate can be increased, and hence various defects such as low liquid crystal efficiency and non-uniform black-state distribution caused by the unevenness of the array substrate can be reduced.

The following points should be noted:

(1) The accompanying drawings in the embodiments of the present disclosure only involve structures relevant to the embodiments of the present disclosure, and other structures may refer to the prior art.

(2) For clarity, in the accompanying drawings of the embodiments of the present disclosure, the thickness and the size of layers or microstructures are enlarged. It should be understood that: when an element such as a layer, a film, a region or a substrate is referred to as being disposed "on" or "beneath" another element, the element may be "directly" disposed "on" or "beneath" another element, or an intermediate element may be provided.

(3) The characteristics in the same embodiment or different embodiments of the present disclosure may be mutually combined without conflict.

The foregoing is only the preferred embodiments of the present disclosure and not intended to limit the scope of protection of the present disclosure. Any change or replacement that may be easily thought of by those skilled in the art within the technical scope disclosed by the present disclosure shall fall within the scope of protection of the present disclosure. Therefore, the scope of protection of the present disclosure shall be defined by the appended claims.

The application claims priority to the Chinese patent application No. 201610284394.7, filed Apr. 29, 2016, the disclosure of which is incorporated herein by reference as part of the application.

The invention claimed is:

1. A method for manufacturing an array substrate, comprising:
    forming a passivation layer on a base substrate;
    forming photoresist on the passivation layer, and forming a first photoresist pattern including a photoresist-completely-retained region, a photoresist-partially-retained region and a photoresist-completely-removed region, by exposure and development processes;
    forming a first through hole in the passivation layer by etching the passivation layer with the first photoresist pattern as a mask;
    forming a second photoresist pattern by performing ashing on the first photoresist pattern to remove the photoresist in the photoresist-partially-retained region and reduce a thickness of the photoresist in the photoresist-completely-retained region; and
    etching the passivation layer with the second photoresist pattern as a mask, so as to reduce a thickness of the passivation layer in the photoresist-partially-retained region, wherein
    the photoresist-completely-removed region of the first photoresist pattern corresponds to an area on the passivation layer, at which the first through hole is formed; and the photoresist-partially-retained region of the first photoresist pattern corresponds to an area on the passivation layer, of which the thickness is reduced, and
    the passivation layer includes an area having a first height and an area having a second height; the first height is greater than the second height; the photoresist-partially-retained region of the first photoresist pattern corresponds to the area having the first height; and the photoresist-completely-retained region of the first photoresist pattern corresponds to the area having the second height.

2. The method for manufacturing the array substrate according to claim 1, wherein the thickness of the passivation layer in the photoresist-partially-retained region is reduced, so that an upper surface of the area of the passivation layer having the first height and an upper surface of the area of the passivation layer having the second height can have a same height.

3. The method for manufacturing the array substrate according to claim 2, wherein the first photoresist pattern, including the photoresist-completely-retained region, the photoresist-partially-retained region and the photoresist-completely-removed region, is formed by performing exposure and development on the photoresist with a gray-tone mask or a half-tone mask as a mask.

4. The method for manufacturing the array substrate according to claim 1, further comprising:
    determining a thickness to be reduced of the area of the passivation layer having the first height according to a height difference between the first height and the second height.

5. The method for manufacturing the array substrate according to claim 4, wherein the reduced thickness is less than the thickness of the passivation layer.

6. The method for manufacturing the array substrate according to claim 5, further comprising:
    calculating an etching rate and an etching time, required by the etching of the passivation layer having the reduced thickness, according to the reduced thickness.

7. The method for manufacturing the array substrate according to claim 5, wherein the first photoresist pattern, including the photoresist-completely-retained region, the photoresist-partially-retained region and the photoresist-completely-removed region, is formed by performing exposure and development on the photoresist with a gray-tone mask or a half-tone mask as a mask.

8. The method for manufacturing the array substrate according to claim 4, further comprising:
    calculating an etching rate and an etching time, required by the etching of the passivation layer having the reduced thickness, according to the reduced thickness.

9. The method for manufacturing the array substrate according to claim 4, wherein the first photoresist pattern, including the photoresist-completely-retained region, the photoresist-partially-retained region and the photoresist-completely-removed region, is formed by performing exposure and development on the photoresist with a gray-tone mask or a half-tone mask as a mask.

10. The method for manufacturing the array substrate according to claim 1, wherein the first photoresist pattern, including the photoresist-completely-retained region, the photoresist-partially-retained region and the photoresist-completely-removed region, is formed by performing exposure and development on the photoresist with a gray-tone mask or a half-tone mask as a mask.

11. The method for manufacturing the array substrate according to claim 10, wherein a fully transparent area of the gray-tone mask or the half-tone mask corresponds to the photoresist-completely-removed region of the first photoresist pattern; a semitransparent area of the gray-tone mask or the half-tone mask corresponds to the photoresist-partially-retained region of the first photoresist pattern; and an opaque area of the gray-tone mask or the half-tone mask corresponds to the photoresist-completely-retained region of the first photoresist pattern.

12. The method for manufacturing the array substrate according to claim 1, before forming the passivation layer, further comprising:
    forming a thin-film transistor (TFT), wherein the area of the passivation layer having the first height correspond to an area provided with the TFT.

13. The method for manufacturing the array substrate according to claim 1, further comprising:
    forming a first electrode on the passivation layer, in which the first electrode is at least formed on the area of the passivation layer having the second height.

14. The method for manufacturing the array substrate according to claim 13, wherein the thickness of the passivation layer in the photoresist-partially-retained region is reduced, so that an upper surface of the area of the passivation layer having the first height and an upper surface of the first electrode can have a same height.

15. The method for manufacturing the array substrate according to claim 13, further comprising:
    forming an insulating layer on the first electrode; and
    forming a second electrode on the insulating layer.

16. The method for manufacturing the array substrate according to claim 15, wherein the thickness of the passivation layer in the photoresist-partially-retained region is reduced, so that a difference between the height of an upper surface of the passivation layer in the photoresist-partially-retained region and the height of an upper surface of the passivation layer in the photoresist-completely-retained region can be equal to a total thickness of the first electrode and the second electrode.

17. An array substrate, manufactured by the method for manufacturing the array substrate according to claim 1.

* * * * *